United States Patent
Chung et al.

(10) Patent No.: US 7,239,543 B2
(45) Date of Patent: Jul. 3, 2007

(54) MAGNETIC TUNNEL JUNCTION CURRENT SENSORS

(75) Inventors: Young Sir Chung, Chandler, AZ (US); Robert W. Baird, Gilbert, AZ (US); Mark A. Durlam, Chandler, AZ (US); Gregory W. Grynkewich, Gilbert, AZ (US); Eric J. Salter, Scottsdale, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 56 days.

(21) Appl. No.: 11/262,053

(22) Filed: Oct. 28, 2005

(65) Prior Publication Data

US 2007/0097732 A1    May 3, 2007

(51) Int. Cl.
*G11C 11/00* (2006.01)
(52) U.S. Cl. .................. 365/158; 365/171; 365/185.2; 365/189.09; 365/226
(58) Field of Classification Search ............. 365/158, 365/171, 185.2, 189.09, 226
See application file for complete search history.

(56) References Cited

U.S. PATENT DOCUMENTS

| | | | |
|---|---|---|---|
| 6,310,470 B1 | 10/2001 | Hebing et al. | |
| 6,362,618 B1 | 3/2002 | Motz | |
| 6,429,640 B1 | 8/2002 | Daughton et al. | |
| 6,501,679 B2 * | 12/2002 | Hidaka | 365/173 |
| 6,795,334 B2 * | 9/2004 | Iwata et al. | 365/158 |
| 6,885,579 B2 * | 4/2005 | Sakimura et al. | 365/158 |
| 7,116,595 B2 * | 10/2006 | Hidaka | 365/207 |
| 2002/0024333 A1 | 2/2002 | Maiwald | |

* cited by examiner

*Primary Examiner*—Tuan T. Nguyen
(74) *Attorney, Agent, or Firm*—Ingrassia Fisher & Lorenz (57) ABSTRACT

An integrated circuit device includes an active circuit component and a current sensor. The active circuit component may be coupled between a first conductive layer and a second conductive layer, and is configured to produce a first current. The current sensor is disposed over the active circuit component. The current sensor may includes a Magnetic Tunnel Junction ("MTJ") core disposed between the first conductive layer and the second conductive layer. The MTJ core is configured to sense the first current and produce a second current based on the first current sensed at the MTJ core.

20 Claims, 6 Drawing Sheets

MAGNETIC TUNNEL JUNCTION CURRENT SENSORS

TECHNICAL FIELD

The present invention relates generally to electronic devices. More particularly, the present invention relates to an integrated circuit device that includes sensing capability, and more particularly to current sensors implementing magnetic tunnel junctions (MTJ).

BACKGROUND

MRAM is a nonvolatile memory technology that uses magnetic polarization to store data, in contrast to other RAM technologies that use electronic charges to store data. One primary benefit of MRAM is that it retains the stored data in the absence of applied system power, thus, it is a nonvolatile memory. Generally, MRAM includes a large number of magnetic cells formed on a semiconductor substrate, where each cell represents one data bit. Information is written to a cell by changing the magnetization direction of the magnetic free layer within the cell, and a bit is read by measuring the resistance of the cell (low resistance typically represents a "0" bit and high resistance typically represents a "1" bit).

An MRAM device generally includes an array of cells that are interconnected using conductive bit lines, conductive digit lines, and/or local interconnects and the like. Practical MRAM devices are fabricated using known semiconductor process technologies. For example, the bit and digit lines are formed from different metal layers, which are separated by one or more insulating and/or additional metal layers. Conventional fabrication processes allow distinct MRAM devices to be easily fabricated on a devoted substrate.

Smart power integrated circuits are single-chip devices capable of generating and providing operating power in a controlled and intelligent manner. Smart power integrated circuits typically include a power circuit component, an analog control component, and a digital logic component. Smart power integrated circuits may also include one or more sensors which can be used to measure or detect physical parameters such as position, motion, force, acceleration, temperature, pressure and so forth. Such sensors can be used, for example, to control the output power in response to changing operating conditions. For example, in cell phones, smart power products can be engineered to regulate power consumption, amplify audio signals, and supply power to color screens. In inkjet printers, smart power products can help drive the motors and fire the nozzles for ink delivery. In automobiles, smart power products can help control engine and braking systems, airbag deployments, and seat positioning.

For integrated circuits (IC's) which implement smart power and magnetic random access memory (MRAM) designs, current sensing is an important element of power IC design to protect the circuit, device or system.

Existing sensors for measuring parameters such as those mentioned above suffer from various limitations well known in the art. Examples of such limitations include excessive size and weight, inadequate sensitivity and/or dynamic range, cost, reliability and other factors. Thus, there continues to be a need for improved sensors, especially sensors that can be easily integrated with semiconductor devices and integrated circuits and manufacturing methods therefore.

The miniaturization of many modern applications make it desirable to shrink the physical size of electronic devices, integrate multiple components or devices into a single chip, and/or improve circuit layout efficiency. Ideally, such sensors should be manufactured in a cost effective manner which reduces the additional layout area or space the sensors consumes. It would be desirable to have a semiconductor-based device which includes an MRAM architecture integrated with a smart power architecture including sensor components on a single substrate, particularly where the MRAM architecture and the smart power architecture are fabricated using the same process technology such that the sensor is compatible with semiconductor device and integrated circuit structures and fabrication methods.

Accordingly, it is desirable to provide an improved sensor and method, adaptable for measuring various physical parameters. It is further desirable that the improved sensor and method convert the physical parameter being measured into an electrical signal. It would be desirable to provide sensors which exhibit improved measurement performance and which can be integrated in a three-dimensional architecture. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques and features related to MRAM design, MRAM operation, semiconductor device fabrication, and other aspects of the integrated circuit devices may not be described in detail herein. Furthermore, the circuit/component layouts and configurations shown in the various figures contained herein are intended to represent example embodiments of the invention. It should be noted that many alternative or additional circuit/component layouts may be present in a practical embodiment.

The following description may refer to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

A practical MRAM architecture can be formed on a substrate using a suitable semiconductor fabrication process. In practice, MRAM structures described herein can be formed using a conventional MRAM fabrication process. A practical MRAM device will typically include millions of cells. Generally, an MRAM architecture includes at least one digit line formed from one metal layer, at least one bit line formed from another metal layer, and a magnetic tunnel junction ("MTJ") core formed between the two metal layers. The MTJ core includes cells that form an array of memory locations for the MRAM architecture.

Figure 1:
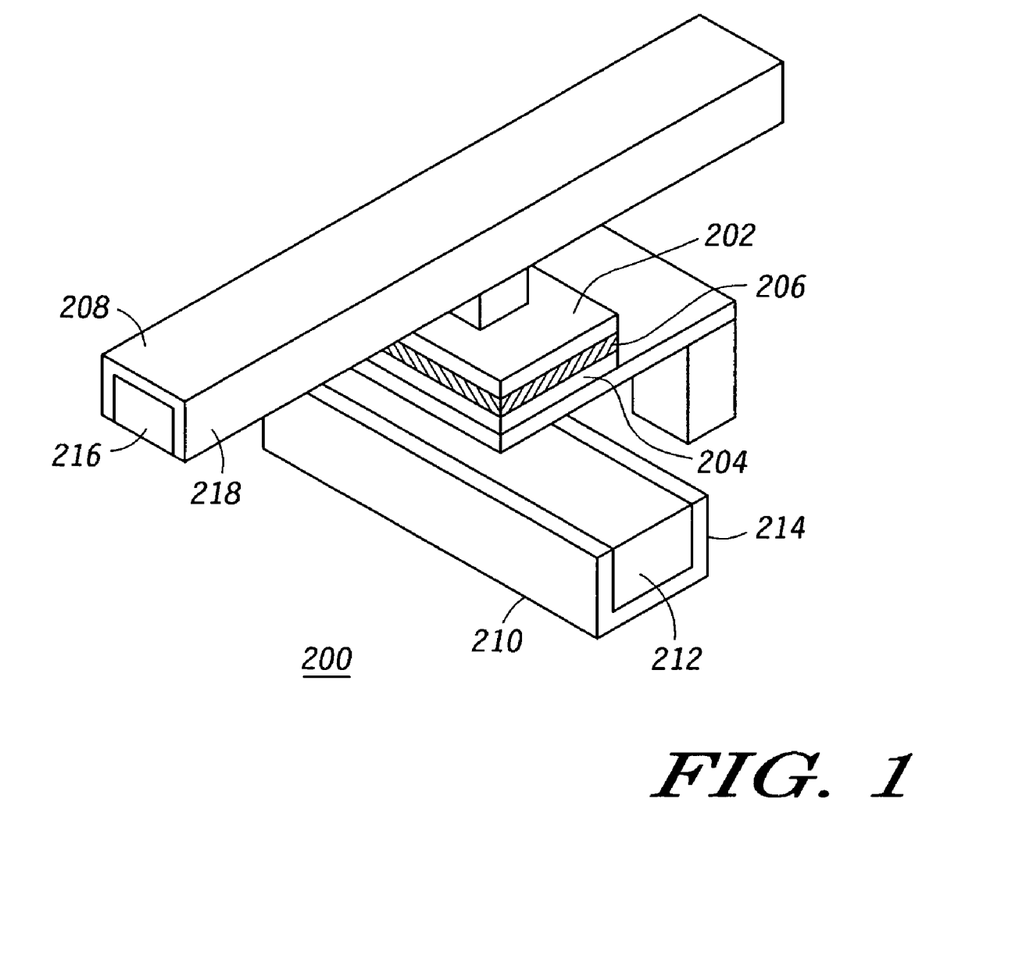
FIG. 1 is a schematic perspective view of an MRAM cell configured according to an exemplary embodiment.

FIG. 1 is a schematic perspective view of an MRAM cell 200 configured according to an exemplary embodiment. Each cell in an MRAM architecture may be configured as shown in FIG. 1. MRAM cell 200 generally includes either an upper ferromagnetic or synthetic antiferromagnetic ("SAF") layer 202, or a lower ferromagnetic or SAF layer 204, and a tunnel barrier layer 206 between the two ferromagnetic layers. In this example, the upper ferromagnetic or SAF layer 202 composes the free magnetic layer because the direction of its magnetization can be switched to change the bit status of cell 200. Lower ferromagnetic or SAF layer 204, however, is the fixed magnetic layer because the direction of its magnetization is pinned in one direction and does not change direction of polarization during normal operating conditions. When the magnetization in upper ferromagnetic or SAF layer 202 is parallel to the magnetization in lower ferromagnetic layer 204, the resistance across cell 200 is in its low resistance state. When the magnetization in upper ferromagnetic layer 202 is anti-parallel to the magnetization in lower ferromagnetic layer 204, the resistance across cell 200 is in its high resistance state. The data ("0" or "1") in a given cell 200 is read by measuring the resistance of the cell 200. The techniques utilized to read and write data to MRAM cell 200 are known to those skilled in the art and, therefore, will not be described in detail herein.

FIG. 1 also depicts a bit line 208 and a digit line 210 (individually and collectively referred to herein as "program lines") corresponding to cell 200. The orientation of the magnetization in free magnetic layer 202 rotates in response to applied current pulses from the digit and bit lines for toggle applications and makes a complete 180 degree reversal when both digit and bit line pulses are applied simultaneously for the single magnetic free layer (or conventional) application. In a typical non-toggle MRAM, the orientation of the bit is switched by reversing the polarity of the current in bit line 208 while keeping a constant polarity of the current in digit line 210. In a practical deployment, bit line 208 may be connected to any number of similar MRAM cells (e.g., a column of cells) to provide a common write current to each of the connected cells. Similarly, digit line 210 may be associated with any number of similar MRAM cells (e.g., a row of cells) to provide a common digit current to each of the cells.

In the preferred embodiment shown in FIG. 1, magnetic cladding or shielding layers 214, 218 can be provided to improve efficiency, stability and reduce signal noise/interference due to current routings adjacent to the MRAM cell. In this example, digit line 210 includes a conductive digit element 212 and a permeable cladding material 214 formed from a soft magnetic material. In this example, cladding 214 partially surrounds conductive element 212. In particular, cladding 214 is formed around three sides of conductive element 212 such that the upward facing surface of conductive element 212 remains uncladded. In the preferred embodiment shown in FIG. 1, line 208 includes a conductive bit element 216 and cladding 218 formed from a permeable magnetic material. In this example, cladding 218 partially surrounds conductive element 216. In particular, cladding 218 is formed around three sides of conductive element 216 such that the downward facing surface of conductive element 216 remains uncladded. Cladding 214/218 may be utilized to focus the magnetic flux toward the MTJ to improve the efficiency of programming. The cladding has an additional benefit of reducing the write disturbance to neighboring bits. In practical embodiments, the magnetic cladding is an integral part of the barrier layers used in the fabrication of copper program lines used in the MRAM process.

In practical embodiments, conductive element 212 and conductive element 216 are formed from an electrically conductive material such as copper, and cladding 214/218 is formed from a soft, permeable magnetic material such as NiFe, a nickel-iron-cobalt alloy, a cobalt-iron alloy, or the like. In one example embodiment, cladding 214/218 is approximately 200 Angstroms thick (the sidewalls of cladding 214/218 may be slightly thinner). Although the conductive elements and the cladding are realized from different materials, conductive element 212 and cladding 214 are considered to be fabricated at one common metal layer (e.g., the metal four layer), and conductive element 216 and cladding 218 are considered to be fabricated at another common metal layer (e.g., the metal five layer).

The terms "first metal layer" and "second metal layer" may be used herein to differentiate between any two distinct metal layers, and "first metal layer" and "second metal layer" need not indicate the metal one and metal two layers, respectively. In other words, a "first metal layer" means any metal layer within a described integrated circuit device, regardless of any arbitrary layer numbering scheme, and a "second metal layer" means any other metal layer within the described integrated circuit device, regardless of any arbitrary layer numbering scheme.

Smart power integrated circuits can be fabricated using a combinational CMOS process that integrates precision analog, power devices, and logic or a subset of the blocks. Smart power integrated circuits can reduce various components and combine all those functions into a single cost-effective IC including functions of voltage regulation, power MOSFETs, input signal conditioning, transient protection, system diagnostics, and control. ICs using smart power integrated circuits contain various functions, such as power ICs, communication, power management, safety and sensors, and many other special functions. Smart power integrated circuits feature a rich set of mixed signal building blocks including A/D and D/A converters, rail-to-rail op amps, comparators, charge pumps and gate drives, voltage regulators, precision references, digital logic, and non-volatile memory. For driving loads there are power MOSFET devices with inductive energy clamps, independent thermal management, short circuit protection, and diagnostic load sensing.

Figure 2:
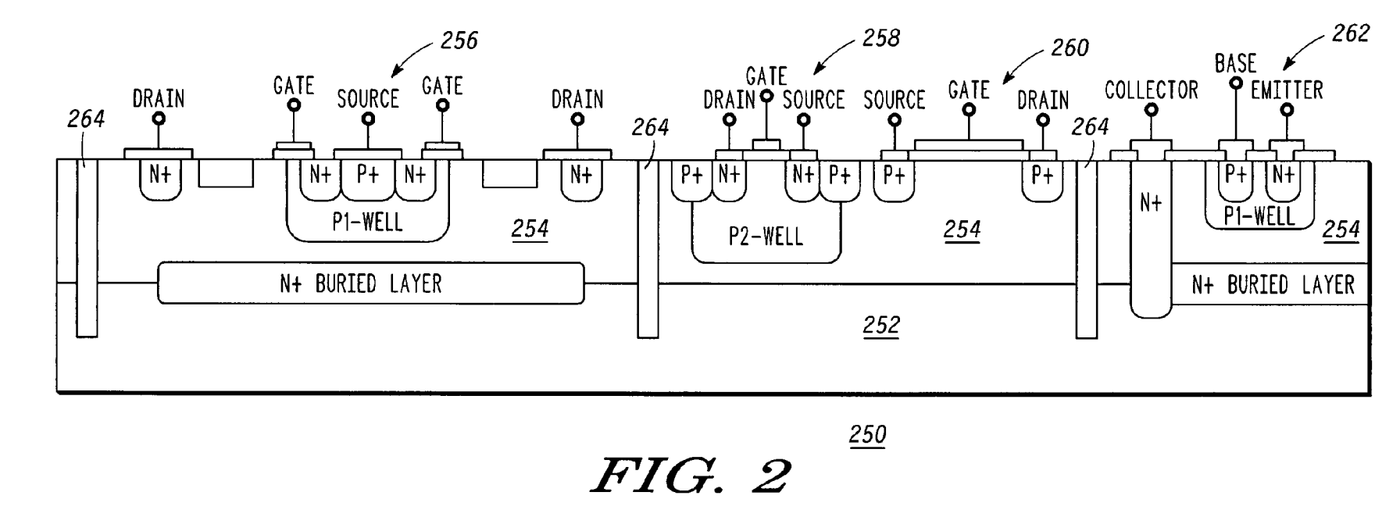
FIG. 2 is a schematic sectional view of a simplified smart power integrated circuit architecture.

FIG. 2 is a schematic view of a simplified smart power integrated circuit architecture 250, which, as an example, is formed on a substrate 252 with an n-epi layer 254 using a suitable semiconductor fabrication process. Smart power integrated circuits can be formed on various types of substrates with and/or without epitaxial layers, employing n-type or p-types. In practice, smart power integrated circuit architecture 250 and other structures described herein can be formed using any suitable integrated circuit fabrication process. Although smart power integrated circuit architecture 250 is depicted with power MOSFET 256, CMOS (n-MOSFET 258 and p-MOSFET 260), and bipolar devices 262, a practical smart power integrated circuit will typically include various active and passive components, such as diodes, resistors, capacitors, inductors, fuses, anti-fuses, and memory devices. Generally, smart power integrated circuit architecture 250 includes at least one metal layer, and additional metal layers are added to increase the circuit density and to enhance circuit performance. Various n-type and p-types wells are formed using well-known semiconductor processing, such as implantation and diffusion. Isolation components 264 could be realized using suitable oxidation and/or trench process.

An embodiment of the invention relates to an integrated circuit device formed on a common substrate and having an MRAM architecture combined with a smart power architecture, where at least a portion of the MRAM architecture and at least a portion of the smart power architecture are concurrently formed by the same fabrication process. As used herein, a smart power architecture includes a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof. Using smart power integrated circuits, designers can reduce the size of the analog portion and the digital logic of practical applications to achieve dense circuitry. This enables designers to economically pack more features and capability into a chip, resulting in reduced die area, reduced cost, and improved performance. This integration helps designers of automotive systems, industrial controls, and consumer electronics simplify system design, lower system cost, and improve reliability.

Figure 3:
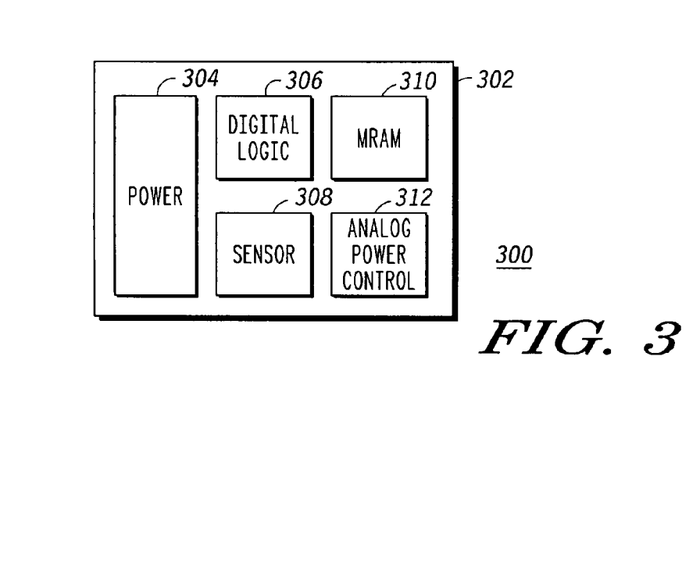
FIG. 3 is a schematic representation of an integrated circuit device configured according to an exemplary embodiment.

FIG. 3 is a schematic representation of an integrated circuit device 300 configured according to an exemplary embodiment. Integrated circuit device 300 generally includes a substrate 302 upon which a number of functional components are formed. Substrate 302 may be any suitable semiconductor material, such as a silicon-based material. The functional components are schematically depicted as blocks in FIG. 3 for ease of illustration. In this example, these functional components include a power circuit component 304, a digital logic component 306, a sensor architecture 308, an MRAM architecture 310, and an analog power control component 312. Although not shown in FIG. 3, integrated circuit device 300 may include additional components as necessary to satisfy the needs of the particular application. In practice, some of these functional components may be coupled together to enable cooperative operation. For example, power circuit component 304, digital logic component 306, sensor architecture 308, and analog power control component 312 may cooperate to form a smart power architecture for integrated circuit device 300. In this regard, these components (individually or in any combination thereof) are also referred to herein as "smart power components." MRAM architecture 310, however, need not be coupled to the other components and MRAM architecture 310 may be configured to function as an independent subsystem of integrated circuit device 300. The embedding of MRAM architecture 310 into a smart power integrated circuit in this manner results in an efficient use of physical space while enabling the fabrication of sensors from layers that are traditionally utilized only in connection with the MTJ core of an MRAM.

In one practical embodiment of the invention, power circuit component 304 includes one or more power MOSFET devices that are configured to operate at high voltages and high currents. Alternate embodiments may employ different power devices and techniques for power circuit component 304. Digital logic component 306 may be realized with CMOS transistors or any suitable digital logic arrangement. Digital logic component 306 is configured to carry out the digital operations that support the smart power architecture of integrated circuit device 300. Analog power control component 312 includes analog circuit components configured to support the smart power architecture of integrated circuit device 300. Analog power control component 312 may include, for example, resistors, capacitors, inductors, MOSFETs, bipolar devices, and/or other analog circuit elements.

Sensor architecture 308 is generally configured to sense one or more physical, electrical, magnetic, environmental, or other conditions for integrated circuit device 300. In this example, integrated circuit device 300 uses the quantity, characteristic, parameter, or phenomena detected by sensor architecture 308 to regulate, control, manage, or monitor the output power generated by power circuit component 304. In this regard, sensor architecture 308 may employ one or more sensors or sensor components, including, without limitation: an environmental condition sensor, such as a temperature sensor, a humidity sensor, a light sensor, a radiation sensor, or the like; an electromagnetic sensor; an electromechanical sensor, such as a transducer; a mechanical sensor, such as a vibration sensor, an accelerometer, a stress/strain sensor, or the like; a magnetic field sensor; or an electrical attribute sensor, such as a voltage sensor, a current sensor, an impedance or resistance sensor, a temperature sensor, a capacitance sensor, an inductance sensor, or the like.

MRAM architecture 310 may be generally configured as described above in connection with FIGS. 1 and 2. Indeed, integrated circuit device 300 may employ conventional MRAM designs and techniques for MRAM architecture 310, and such conventional features will not be described in detail herein. Generally, MRAM architecture 310 includes an MRAM circuit component 314 and an MRAM cell array 316 coupled to MRAM circuit component 314 (see FIG. 4, which is a schematic cross sectional representation of integrated circuit device 300). MRAM circuit component 314 may include any number of elements or features that support the operation of MRAM architecture 310, including, without limitation: switching transistors; input/output circuitry; a decoder; comparators; sense amplifiers; or the like.

Figure 4:
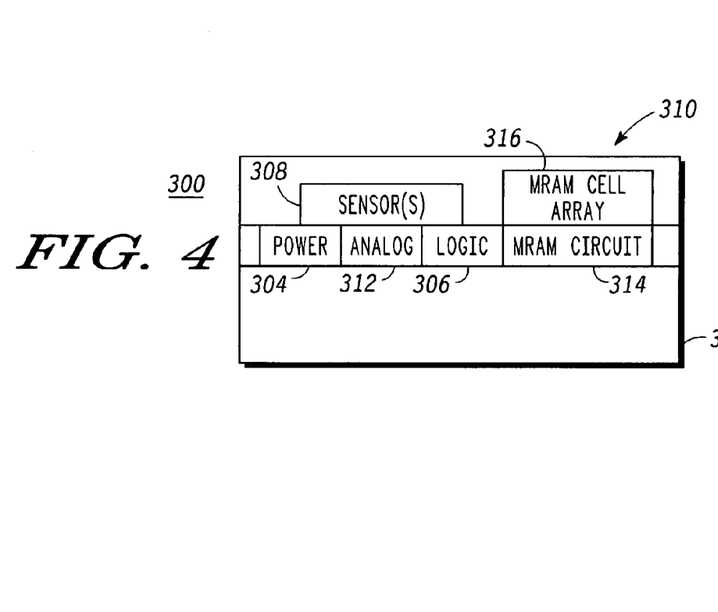
FIG. 4 is a schematic cross sectional representation of the integrated circuit device shown in FIG. 3.

FIG. 4 is a simplified diagram that generally depicts the topological arrangement of the functional components of integrated circuit device 300. In this regard, FIG. 4 illustrates that MRAM architecture 310 is formed on substrate 302, and that the smart power architecture (including power circuit component 304, digital logic component 316, sensor architecture 308, and analog power control component 312 in this example) is formed on substrate 302. FIG. 4 also illustrates that MRAM cell array 316 is formed above MRAM circuit component 314.

In one exemplary embodiment of the invention, integrated circuit device 300 is manufactured using a modular process technology having a front end fabrication process and a back end fabrication process. In this context, the front end fabrication process is performed first in time and is completed before the back end process is initiated. As used herein, the front end fabrication process is associated with the formation of elements or features using "front end layers," which may be N and/or P doped regions within a semiconductor substrate 302, dielectric layers, or other layers, while the back end fabrication process is associated with the formation of elements or features using "back end layers," which may be metal or conductive layers, dielectric layers, MTJ core layers, or other layers. Thus, the front end layers are located in or on the substrate 302, and the back end layers are located above the front end layers. In practice, the front end and back end fabrication processes may utilize well known masking, reactive ion etching, physical sputtering, damascene patterning, physical vapor deposition, electroplating, chemical vapor, and/or plasma enhanced chemical vapor deposition techniques. For example, an integrated circuit as described herein may be manufactured using a process technology that can leverage CMOS, bipolar, or other suitable fabrication processes.

FIG. 4 is a simplified diagram of components and elements of integrated circuit device 300 configured according to an exemplary embodiment. A practical embodiment of integrated circuit device 300 may include additional layers (e.g., metal layers, dielectric layers, and/or a ground plane) than that shown in FIG. 4. In this example, power circuit component 304, analog power control component 312, digital logic component 306, and MRAM circuit component 314 are suitably formed by the front end fabrication process from front end layers. Some or all of these front end components may be concurrently formed by the front end fabrication process. In contrast, sensor architecture 308 (which may include one or more sensors) and MRAM cell array 316 are suitably formed by the back end fabrication process from back end layers. Some or all of these back end components may be concurrently formed by the back end fabrication process. In practice, the front end and back end fabrication processes are modules in the MRAM fabrication process employed to create MRAM architecture 310. Thus, the manufacture of integrated circuit device 300 leverages the existing MRAM fabrication process for purposes of the smart power architecture. In this manner, at least a portion of the smart power architecture and at least a portion of MRAM architecture 310 can be concurrently formed by the chosen MRAM fabrication process.

Figure 5:
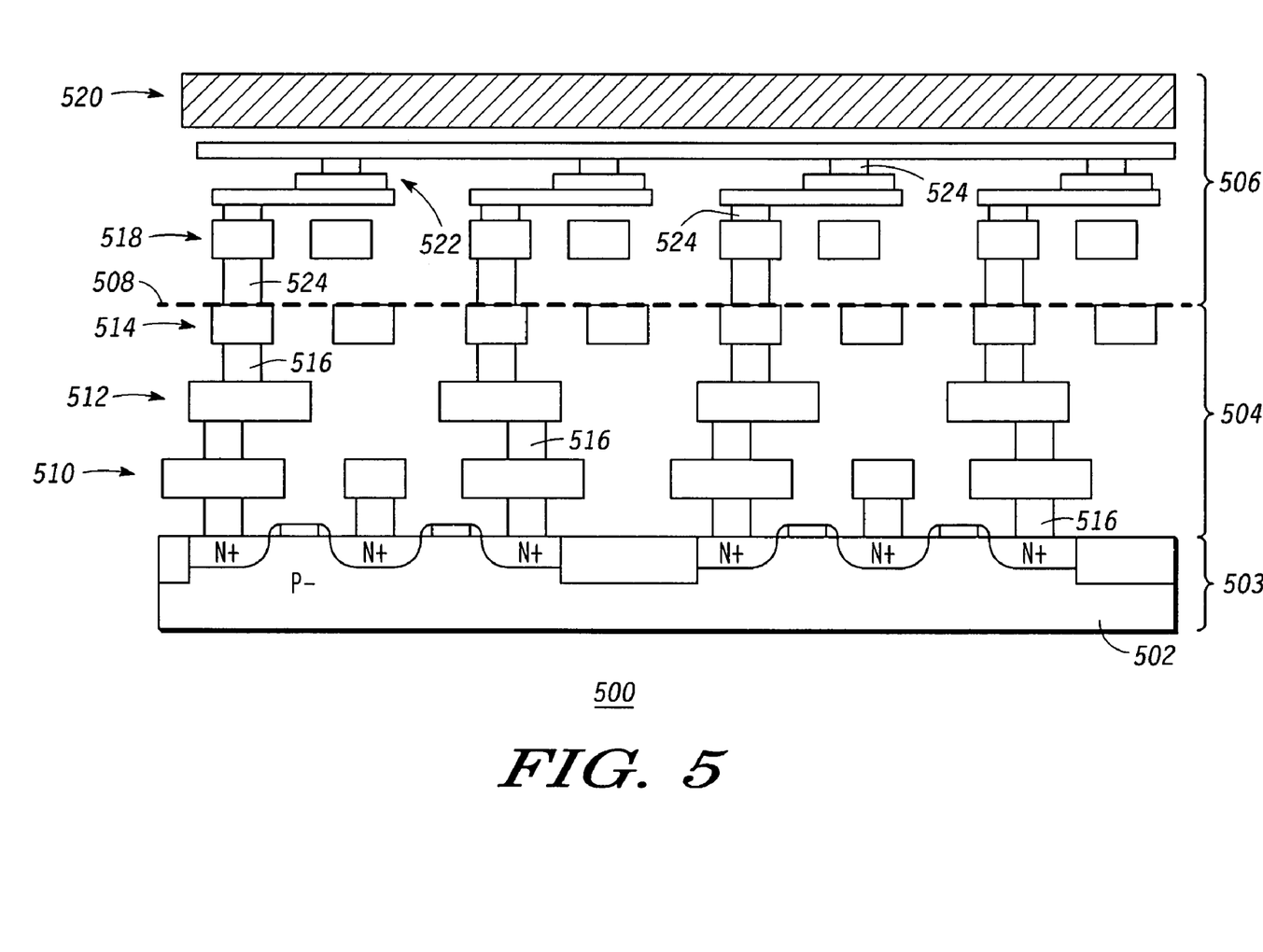
FIG. 5 is a schematic cross sectional representation of an integrated circuit device configured according to an exemplary embodiment.

FIG. 5 is a schematic cross sectional representation of an integrated circuit device 500 configured according to an exemplary embodiment. Integrated circuit device 300 may employ the general structure depicted in FIG. 5. Integrated circuit device 500 represents an example MRAM embedded smart power integrated circuit fabricated in the manner described herein. Integrated circuit device 500 generally includes a substrate 502, front end layers 503 formed in or on substrate 502, and first back end layers 504 and second back end layers 506 formed above front end layers 503. A dashed line 508 in FIG. 5 represents an imaginary dividing line between the first back end fabrication process and the second back end fabrication process.

In one practical embodiment of the invention, first back end layers 503 of integrated circuit device 500 may include a metal-one layer 510, a metal-two layer 512, a metal-three layer 514, intervening dielectric layers (not separately shown in FIG. 5), conductive vias 516 routed between layers, and the like, while second back end layers 506 of integrated circuit device 500 may include a metal-four layer 518, a metal-five layer 520, an MTJ core "layer" 522, intervening dielectric layers (not separately shown in FIG. 5), conductive vias 524 routed between layers, and the like.

As described above, an MTJ core may be realized by more than one layer of material. For the sake of simplicity, however, FIG. 5 depicts the MTJ core as a single "layer" 522. In other embodiments of the invention, integrated circuit device 500 might include more or less front end layers and/or more or less back end layers.

In the example embodiment, power circuit component 304, analog power control component 312, digital logic component 306, and MRAM circuit component 314 are formed using elements created from metal-one layer 510, metal-two layer 512, and/or metal-three layer 514, while sensor architecture 308 and MRAM cell array 316 are formed using elements created from metal-four layer 518, metal-five layer 520, and/or MTJ layer 522. MRAM cell array 316 includes a plurality of bit lines formed on metal-five layer 520, a plurality of digit lines formed on metal-four layer 518, and an array of MTJ cells (the MTJ core layer 522 forms the MTJ cells) formed between metal-four layer 518 and metal-five layer 520. In this example, sensor architecture 308 includes a sensor component that is also formed from MTJ core layer 522. In practice, this sensor component is created with the same back end fabrication process used for the creation of MRAM cell array 316. Sensor architecture 308 may also include an additional sensor component (not shown) that is formed from metal-four layer 518 and/or from metal-five layer 520. Such additional sensor components may represent conductive traces, control circuitry, biasing circuitry, or the like.

A sensor in sensor architecture 308 is suitably configured (along with cooperating circuitry or features if necessary) to suit the needs of the particular application. The sensor, which is fabricated from MTJ core layer 522, is designed such that variations in certain operating conditions cause a related change in the electrical, magnetic, electromagnetic, electromechanical, and/or other characteristics of the sensor. An example, which is described below with reference to FIGS. 6–11, an MTJ-based device could be configured to sense current flowing through a nearby conductor by its reaction to the magnetic field generated by the current flow.

MTJ Current Sensor Implementation

In contrast to conventional practices for sensing current, techniques for use of a magnetic tunnel junction (MTJ) as a current sensor will now be described.

A MTJ includes a free magnetic layer and the pinned magnetic layer. In the pinned magnetic layer, the orientation of the magnetization or "magnetization vector" is typically constant or fixed in one direction, whereas the magnetization orientation in the free magnetic layer can change in both magnitude and direction, for example, from 0° to 180°. A mutual angle between the free magnetic layer and the pinned magnetic layer depends on the orientation of magnetization within the free magnetic layer with respect to the pinned magnetic layer. As the mutual angle between the free magnetic layer and the pinned magnetic layer rotates, the rotation can be used to sense changes in the tunnel magnetic resistance (TMR) of the MTJ.

In one implementation, the MTJ can operate in a parallel state, which takes place when the magnetizations or magnetic vectors of the free layer and the pinned layer are oriented in the same direction and the mutual angle between the free layer and the pinned layer is 0°, or in an anti-parallel state, which takes place when the magnetizations or magnetic vectors of the free layer and the pinned layer are oriented in opposite directions and the mutual angle between the free layer and the pinned layer is 180°. In the parallel state, the TMR of the MTJ core exhibits a relatively low resistance. In the anti-parallel state, the TMR of the MTJ core exhibits a relatively high resistance.

Both the bit line and the digit line may conduct current. The currents flowing within the bit line and/or the digital line cause or generate corresponding magnetic fields. The magnetic fields generated by the bit line and/or the digit line can alter or change the mutual angle between the free magnetic layer and the pinned magnetic layer by causing the magnetization vector of the free layer to rotate as the magnetic field changes thereby changing the mutual angle of the free layer with respect to the pinned layer. Changes in the mutual angle can be used to sense changes of the output TMR of the MTJ.

As such, a change in either of the currents flowing within the bit line and/or the digital line will influence the mutual angle of the MTJ which changes the output TMR of the MTJ. Thus, the magnetic tunnel junction core can sense and convert the magnetic field caused by the bit line and/or the digital line into an output tunnel magnetic resistance (TMR) of the MTJ. By monitoring the output TMR of the MTJ core, fluctuations in current may also be monitored.

Magnetic tunnel junction devices can be utilized to sense the circuit current for various circuit monitoring purposes such as feedback control, over-current protection, and circuit operation shutdown. Due to the nature of a MTJ, a MTJ current sensor can exhibit high-precision current monitoring capability. The MTJ current sensor shares the same components as an MRAM cell thereby allowing components of MRAM cells to be used as a current sensor as well as non volatile memory (NVM). In addition, the MTJ current sensors described herein offer excellent design flexibility since the MTJ current sensors can be integrated three-dimensionally in that they can be positioned vertically or laterally over active circuit or "smart power" components which are typically fabricated in the substrate of an integrated circuit. For example, the MTJ current sensor can be disposed anywhere within the insulating layer(s), above substrate, in the vicinity of active circuit or "smart power" components. This can allow for savings in layout area. These properties can allow for processing in a cost effective manner and improve the overall performance of the current sensor.

Figure 6:
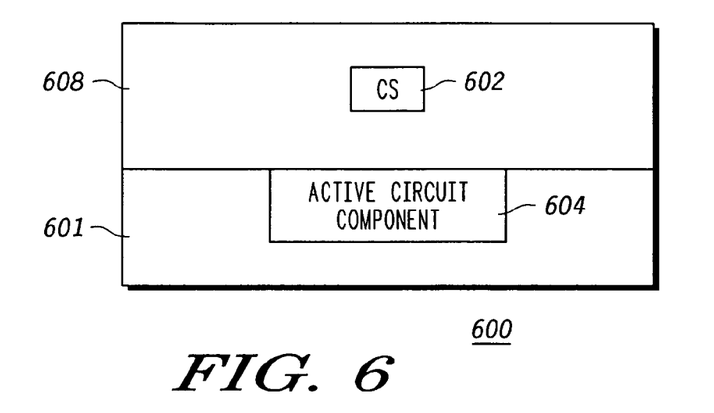
FIG. 6 is a simplified diagram of components and elements of integrated circuit device configured according to an exemplary embodiment.

FIG. 6 is a simplified diagram of components and elements of integrated circuit device 600 configured according to an exemplary embodiment. A practical embodiment of integrated circuit device 600 may include additional layers (e.g., metal layers, dielectric layers, and/or a ground plane) other than those shown in FIG. 6.

As shown in FIG. 6, the integrated circuit device 600 comprises a dummy MRAM cell 602 and an active circuit component 604. The active circuit component 604 can be formed or fabricated in a substrate layer 601, while the dummy MRAM cell 602 can be formed in an insulating layer or layer(s) 608 which is disposed above the substrate layer 601 and separates the dummy MRAM cell 602 from the active circuit component 604. Importantly, in this implementation, the dummy MRAM cell 602 is disposed above the active circuit component 604 which can allow for significant layout area savings. The term "dummy" is used herein to refer to MRAM cells used for sensing applications and distinguish the same from conventional MRAM cells used for information storage applications.

In this example, the active circuit component 604 may comprise, for example, a power circuit component, an analog power control component, or a digital logic component which is formed by a front end fabrication process from front end layers. The active circuit component 604 can generally be any integrated device which benefits from monitoring of its input/output current including, but not limited to, "smart power" components.

In contrast, dummy MRAM cell 602 is formed by a back end fabrication process from back end layers. In practice, the front end and back end fabrication processes are sub-processes in the MRAM fabrication process employed to create an MRAM architecture (not shown). Thus, the manufacture of integrated circuit device 600 leverages the existing MRAM fabrication process for purposes of the smart power architecture.

In this embodiment, the dummy MRAM cell 602 can act as a three-dimensionally integrated "current sensor (CS)" since it can be used to sense current from the active circuit component 604. Although not show in FIG. 6 for simplicity of illustration, the dummy MRAM cell 602 generally comprises a digit line, a bit line, and a magnetic tunnel junction ("MTJ") core disposed between said digit line and said bit line such as that shown in FIG. 1. The active circuit component 604 generates a circuit current (Ickt), and can be electrically coupled between the digit line and the bit line. The dummy MRAM cell 602, particularly its magnetic tunnel junction core, is electromagnetically coupled to said active circuit component 604. This allows the magnetic tunnel junction core to sense the circuit current (Ickt), and then generate or produce a sensed current (Isense) based on the circuit current (Ickt).

Figure 7:
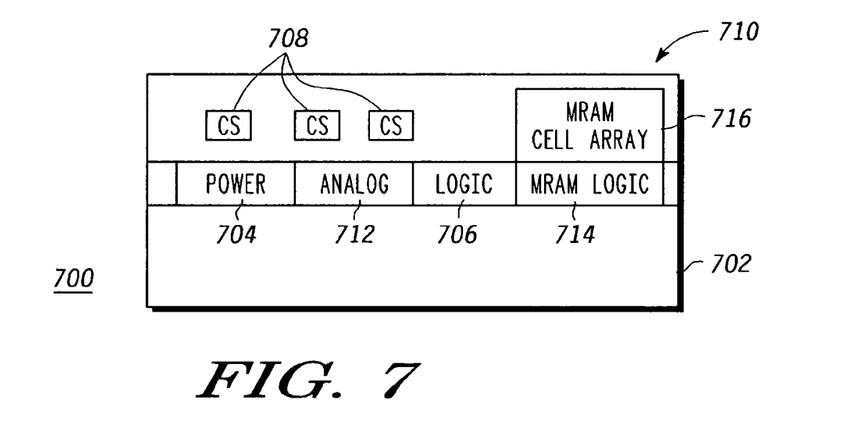
FIG. 7 is a simplified diagram of components and elements of integrated circuit device configured according to an exemplary embodiment.

FIG. 7 is a simplified diagram of components and elements of integrated circuit device 700 configured according to an example embodiment of the invention. In this embodiment, a number of magnetic tunnel junction (MTJ) current sensors 708 can be implemented in conjunction with "smart power" IC's 704, 706, 712 and MRAM circuitry 714, 716. A practical embodiment of integrated circuit device 700 may include additional layers (e.g., metal layers, dielectric layers, and/or a ground plane) other than those shown in FIG. 7.

The integrated circuit device 700 comprises a substrate 702, a magnetic random access memory ("MRAM") architecture 710 formed on said substrate 702, a sensor architecture comprising dummy MRAM cells 708 which can be utilized as current sensors (CSs) formed on said substrate 702, and active circuit components 704, 706, 712 formed within the substrate. The MRAM architecture 710 may comprise an MRAM logic circuitry 714 and an MRAM cell array 716.

As noted above, the MRAM cell array 716 comprises a plurality of MRAM cells. Each of the plurality of MRAM cells may comprise a number of components which are not shown in FIG. 7 for simplicity of illustration. For instance, as described above with respect to FIG. 1, each MRAM cell may comprise a digit line formed from said first metal layer; a bit line formed from said second metal layer; and a magnetic tunnel junction ("MTJ") core formed between said first metal layer and said second metal layer.

In this description, the term "particular" is used to distinguish between components of the dummy MRAM cells and corresponding components of the regular MRAM cells. Each of the dummy MRAM cells 708 or current sensors (CSs) may comprise the same components as the MRAM cells and are fabricated concurrently with the MRAM cells. Again, these components of the dummy MRAM cells are not shown in FIG. 7 for simplicity of illustration, however, each particular dummy MRAM cell may include a particular digit line formed from a first metal layer, a particular bit line formed from a second metal layer, and a particular magnetic tunnel junction ("MTJ") core disposed between said first metal layer and said second metal layer.

The active circuit components are sometimes referred to as "smart power" components, and may comprise, for example, a power circuit component 704, an analog power control component 712, a digital logic component 706. Each of the active circuit components can be formed within the substrate 702, and each particular magnetic tunnel junction core or current sensor (CS) 708 can be formed, for example, above or over a corresponding active circuit component 704, 706, 712 to conserve layout area. Alternatively, each particular magnetic tunnel junction core or current sensor (CS) 708 can be formed, for example, adjacent a corresponding active circuit component 704, 706, 712.

In the exemplary embodiment shown in FIG. 7, the power circuit component 704, analog power control component 712, digital logic component 706, and MRAM circuit component 714 are suitably formed by the front end fabrication process from front end layers. Some or all of these front end components may be concurrently formed by the front end fabrication process.

In contrast, sensor architecture 708 (which may include one or more sensors) and MRAM cell array 716 are formed by the back end fabrication process from back end layers. As described above, "back end" layers are layers formed after "front end" layers. Some or all of these back end components may be concurrently formed by the back end fabrication process. In practice, the front end and back end fabrication processes are sub-processes in the MRAM fabrication process employed to create MRAM architecture. Thus, the manufacture of integrated circuit device 700 leverages the existing MRAM fabrication process for purposes of the smart power architecture. In this manner, at least a portion of the smart power architecture and at least a portion of MRAM architecture can be concurrently formed by the chosen MRAM fabrication process.

Figure 8:
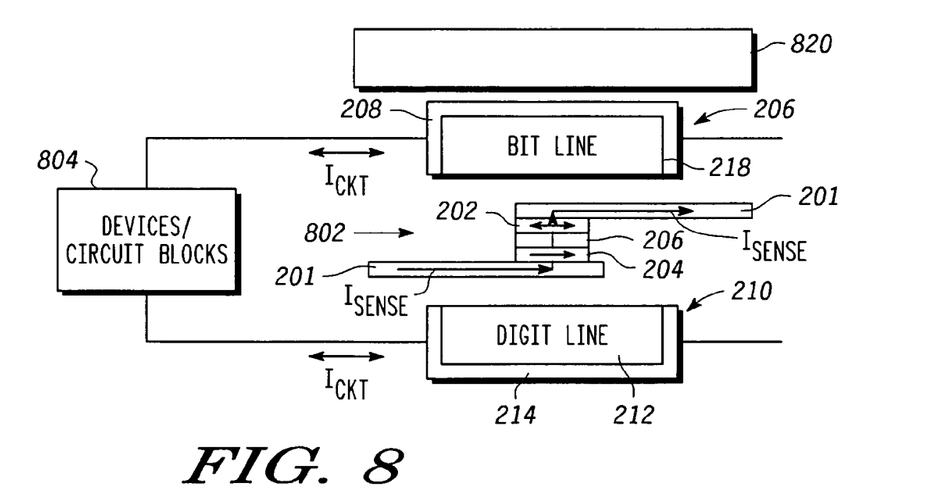
FIG. 8 is a circuit diagram which illustrates an implementation of an MTJ core current sensor for sensing current changes in an associated active circuit (or "smart power") component according to an exemplary embodiment.

FIG. 8 is a block circuit diagram which illustrates an implementation of a MTJ core current sensor 802 for sensing current changes in an associated active circuit (or "smart power") component 804.

As shown in FIG. 8, the active circuit component 804 can be electrically coupled between one of the particular digit lines 210 and one of the particular bit lines 208. The active circuit component 804, the particular bit line 208 and the particular digit line 210 form a circuit which carries a circuit current (Ickt) generated by the active circuit component 804. The magnetic tunnel junction core current sensor 802 associated with the active circuit component 804 is electromagnetically coupled to that active circuit component. The magnetic tunnel junction core current sensor 802 responds to changes in the circuit current (Ickt). In particular, the TMR of a magnetic tunnel junction core 802 varies as a function of the circuit current (Ickt) generated by the active circuit component 804 As such, the magnetic tunnel junction core current sensor 802 can sense the circuit current (Ickt) and generate a sensed current (Isense) in response to the circuit current (Ickt).

As noted above with respect to FIG. 1, the MTJ core of an MRAM cell typically comprises a first electrode which can be formed of either an upper ferromagnetic or synthetic antiferromagnetic ("SAF") layer 202, a second electrode which can be formed of either a lower ferromagnetic or SAF layer 204, and a tunnel barrier layer 206 between the two ferromagnetic layers. The free magnetic layer 202 and the pinned magnetic layer 204 are made of a magnetic materials, such as NiFe. Magnetization occurs during processing by combining certain materials in the presence of a magnetic field. In the pinned magnetic layer 204, the orientation of the magnetization is typically constant or fixed in one direction.

For instance, in FIG. 8, the orientation of the magnetization of the pinned magnetic layer 204 is shown as pointing right. By contrast, the magnetization orientation in the free magnetic layer 202 can change in both magnitude and direction, for example, from 0° to 180°.

A mutual angle between the free magnetic layer 202 and the pinned magnetic layer 204 can be defined as the orientation of magnetization of the free layer 202 with respect to the pinned layer 204, or vice-versa. The mutual angle between the free magnetic layer 202 and the pinned magnetic layer 204 depends on the orientation of magnetization within the free magnetic layer 202 with respect to the pinned magnetic layer 204. Based on this mutual angle, the MTJ core 802 can operate in at least two different states.

One state, sometimes referred to as a parallel state, takes place when the magnetizations of the free layer 202 and the pinned layer 204 are oriented in the same direction and the mutual angle between the free layer 202 and the pinned layer 204 is 0°. In the parallel state, the TMR of the MTJ core 802 exhibits a relatively low resistance. By contrast, another state, sometimes referred to as an anti-parallel state, takes place when the magnetizations of the free layer 202 and the pinned layer 204 are oriented in opposite directions and the mutual angle between the free layer 202 and the pinned layer 204 is 180°. This occurs, for example, when the magnetization of the free layer 202 is to the left and the magnetization of the pinned layer 204 to the right. In the anti-parallel state, the TMR of the MTJ core 802 exhibits a relatively high resistance.

Both the bit line 206 and the digit line 210 may conduct current. In the nonlimiting example shown in FIG. 8, the bit line 206 carries current from right to left (or vice-versa) while the digit line 210 carries current in or out of the page. The currents flowing within the bit line 206 and/or the digital line 210 cause or generate corresponding magnetic fields.

The magnetic fields generated by the bit line 206 and/or the digit line 210 can alter or change the mutual angle between the free magnetic layer 202 and the pinned magnetic layer 204. As such, a change in either of the currents flowing within the bit line 206 and/or the digital line 210 will influence the mutual angle of the MTJ core 802. As noted above, changing the mutual angle of the MTJ core 802 alters or changes the output TMR of the MTJ core 802. Stated differently, the magnetic field sensed by the MTJ core 802 can therefore influence the output tunnel magnetic resistance (TMR) of the MTJ core 802. The magnetic tunnel junction core 802 can therefore be used to convert the magnetic field caused by the bit line 206 and/or the digital line 210 into an output tunnel magnetic resistance (TMR). Conversely, by monitoring the output TMR of the MTJ core 802, fluctuations in current may also be monitored.

The strength of the magnetic field experienced by the MTJ core 802 is dependent upon the current running through the bit line 206 and/or the digit line 210 as well as the distance between the MTJ core 802 and the bit line 206 and/or the digit line 210. The distance between the MTJ core 802 and the bit line 206 and/or the digit line 210 can be controlled during the fabrication process. By modifying the distance between the MTJ core 802 and the bit line 206 and/or the digit line 210, the sensitivity of the current sensor may be adjusted to fit design needs.

In addition, an additional thick magnetic shielding layer or layers 820 can be provided over the cladding 218. The thick magnetic shielding layer is placed above the MTJ current sensor to protect the MTJ current sensor from external noise so that the MTJ current sensor only senses the particular currents which are associated with the circuit or device to be sensed. The additional thick magnetic shielding layer 820 can protect the current signal to be sensed from external noise caused by external sources. This can allow for more precise measurements.

As will now be described with respect to FIGS. 9–11 and with reference to FIG. 1, when implementing the MTJ core current sensor 202, 204, 206, current sensor stability can be further improved by modifying or varying the geometry of electrodes 202, 204 of the MTJ core current sensor 202, 204, 206. For example, variables such as the aspect ratio, relative orientation, size and shape of the electrodes 202, 204 of the MTJ core current sensor 202, 204, 206 can be varied as described below in FIGS. 9–11.

Figure 9:
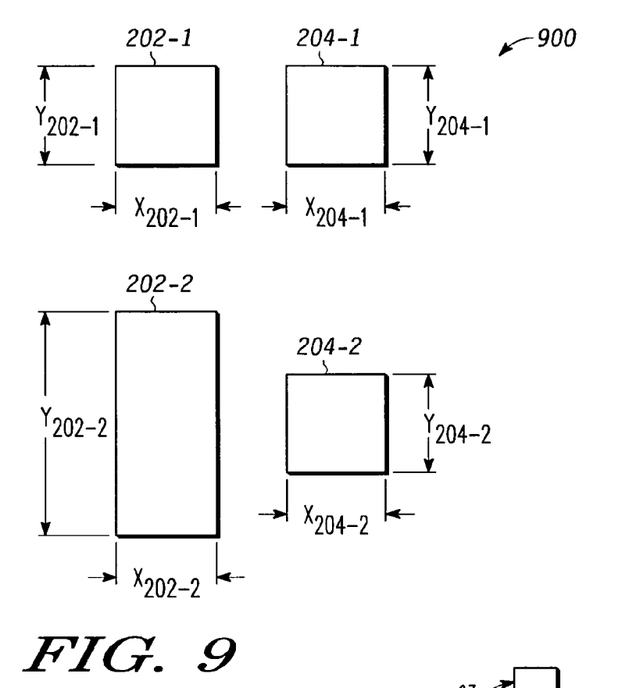
FIG. 9 is an exploded plan view of the electrodes of a MTJ according to an embodiment of the invention where at least one of the electrodes is square.

FIG. 9 shows exploded plan view 900 of electrodes 202, 204 of MTJ core current sensor 202, 204, 206 according to an embodiment of the invention where at least one of the electrodes is square. Electrodes 202, 204 are shown as being laterally displaced in FIG. 9 so that their relative shape and size may be more easily seen. However, when assembled to form MTJ core current sensor 202, 204, 206, they lie one above the other, that is, electrode 204 above electrode 202. Electrodes 202-1, 204-1 are shown as being substantially square, that is having X and Y dimensions $Y_{202-1}=X_{202-1}=Y_{204-1}=X_{204-1}$. For convenience of explanation, this is the representation that has been used up to now for the most part, but that is not essential. Electrodes 202-2, 204-2 are different with electrode 202-2 being rectangular with $Y_{202-2} > X_{202-2}$ and $Y_{204-2}=X_{204-2}$. Again, this is intended merely to be illustrative of various possible shapes of the electrodes and not to be exhaustive or limiting.

Figure 10:
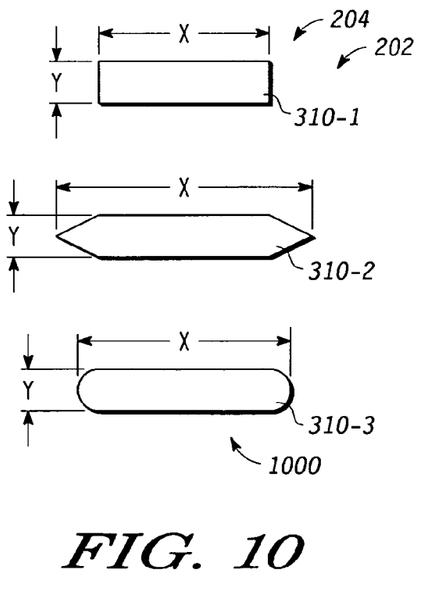
FIG. 10 is an exploded plan view of the electrodes of a MTJ according to embodiments of the invention where either or both electrodes have various exemplary, non-square, shapes.

FIG. 10 shows plan view 1000 of electrodes 202, 204 of a MTJ according to embodiments of the invention where either or both electrodes 202, 204 have various exemplary, non-square, shapes. For example, in 310-1, either or both of electrodes 202, 204 are rectangular and elongated with dimension X significantly greater then Y, in 310-2, either or both of electrodes 202, 204 are elongated with X>>Y and with triangular ends, and in 310-3, either or both of electrodes 202, 204 are elongated with X>>Y and with rounded ends. When electrodes are placed one above the other to form MTJ core current sensor 202, 204, 206, their longer dimensions may make various angles with respect to each other, as is illustrated schematically in FIG. 11. It is useful under certain circumstances to use electrode shapes that are significantly asymmetric since the plan view asymmetry in thin electrodes affects the ease or difficulty with which the electron spin axes may be rotated. For example, while it is known in the art to pin the electron spin axes in the first electrode by heat treatment in the presence of a magnetic field, another approach is to make the electrode shape highly asymmetric, e.g., long and narrow in plan view, since it is very difficult to rotate the electron spin axes away from the long direction of such an asymmetric shape. However, either arrangement for pinning the spin axes may be used.

Figure 11:
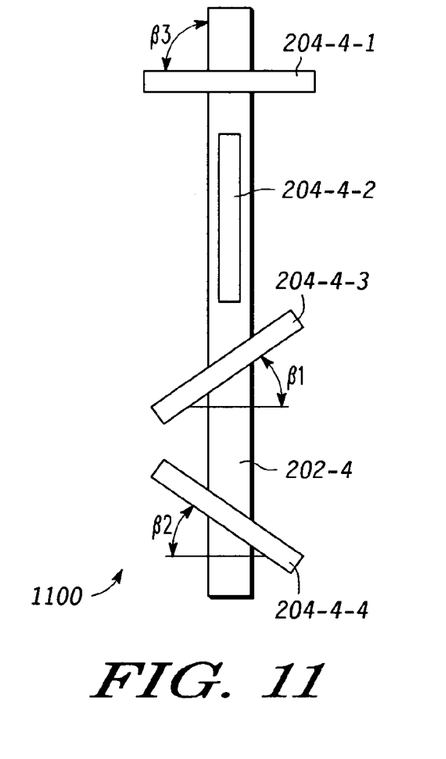
FIG. 11 is a plan view of the electrodes of a MTJ where at least one of the electrodes has various angular arrangements with respect to the other electrode.

In addition, performance of the MTJ core current sensor 202, 204, 206 can also be further improved by optimizing or varying variables such as the proximity of the electrodes 202, 204 of the MTJ core current sensor 202, 204, 206 with respect to the current lines to be sensed, the angles/orientation of the electrodes of the MTJ core current sensor 202, 204, 206 with respect to the current lines to be sensed, and coverage of the electrodes of the MTJ core current sensor 202, 204, 206 with respect to the current lines to be sensed, as described below in FIG. 11.

FIG. 11 shows plan view 1100 of the electrodes 202, 204 of a MTJ according to embodiments of the invention where at least one of the electrodes 202, 204 has various angular arrangements with respect to the other electrode. For convenience of illustration first electrode 202-4 is shown as a single continuous electrode, with various segmented second electrodes 204-4-1 .... 204-4-4 crossing it at different angles. But this is not intended to be limiting and electrode 202-4 can be composed of separate segments, each underlying a single one of second electrodes 204-4-1 .... 204-4-4. Second electrode 204-4-1 is oriented with its long dimension substantially orthogonal ($\beta 3$) to the long dimension of first electrode 202-4. Second electrode 204-4-2 is oriented with its long dimension substantially parallel (or anti-parallel) with the long dimension of first electrode 202-4. Second electrode 204-4-3 is oriented with its long dimension at angle ($\beta 1$) and second electrode 204-4-4 is oriented with its long dimension at angle ($\beta 2$) with respect to the long dimension of first electrode 202-4. Thus, a wide variety of different relative angular orientations may be used for the first and second electrodes 202, 204.

Figure 12:
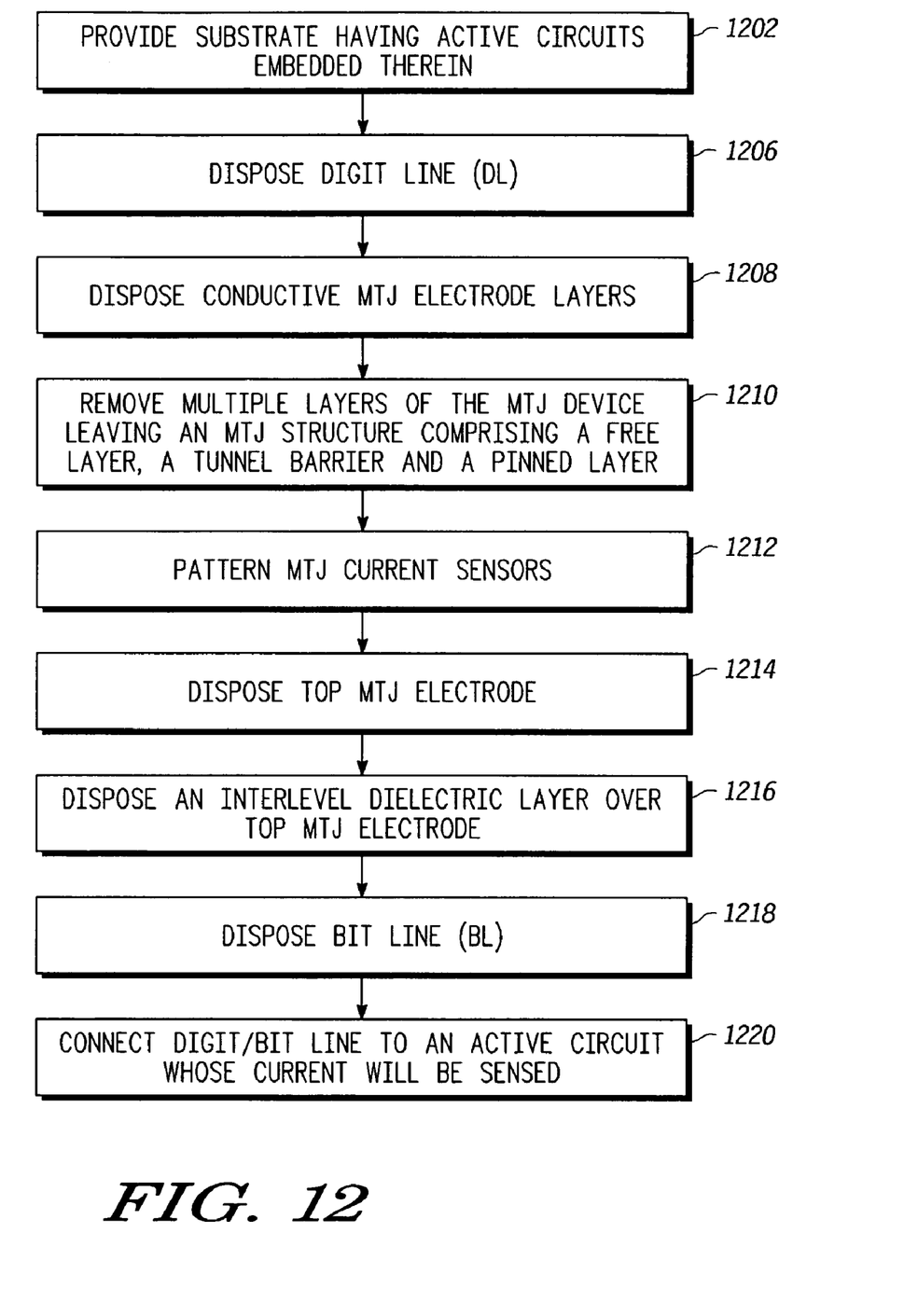
FIG. 12 is a flowchart showing a method of fabricating an MTJ core current sensor according to an exemplary embodiment.

FIG. 12 is a flowchart showing a method of fabricating an MTJ core current sensor according to an exemplary embodiment. At step 1202, a substrate 702 is provided which has active circuit components or devices 704, 706, 712, such as, smart power or analog integrated circuits, embedded therein. At step 1206, a digit line (DL) 210 with magnetic cladding 214 is then disposed using known semiconductor processing techniques. This can happen, for example, by using physical vapor deposition and electroplating to deposit, for example, copper materials. At step 1208, a conductive MTJ electrode layer 201 or bottom MTJ electrode 201 can then disposed using known semiconductor processing techniques. The bottom MTJ electrode 201 may comprise, for instance, Ta metal. At step 1210, multiple layers of the MTJ device are removed using known semiconductor processing techniques, leaving a core MTJ structure comprising a free layer 202, a tunnel barrier 206 and a pinned layer 204. At step 1212, the MTJ current sensors 802 are patterned using conventional lithography techniques. At step 1214, the top MTJ electrode 207 is disposed using known semiconductor processing techniques. At step 1216, an interlevel dielectric layer is disposed over the top MTJ electrode 207. At step 1218, a conductive bit line (BL) 208 is then disposed using known semiconductor processing techniques with magnetic cladding layers or magnetic shielding or both. At step 1220, the DL 210 and/or the BL 208 can be connected to an active circuit component or device 804 whose current needs to be sensed.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An integrated circuit device, comprising:
a substrate;
an MRAM cell array;
a dummy MRAM cell comprising a first conductive layer; a second conductive layer, and a particular magnetic tunnel junction ("MTJ") core disposed between said first conductive layer and said second conductive layer; and
a smart power component formed within the substrate, wherein said smart power component is electrically coupled between the first conductive layer and the second conductive layer, wherein the smart power component is configured to produce a first current;
wherein the particular magnetic tunnel junction core is configured to sense the first current and produce a second current based on the first current.

2. An integrated circuit device according to claim 1, wherein the MRAM cell array comprises a plurality of MRAM cells, wherein each of said plurality of MRAM cells comprises:
a first conductive layer, a second conductive layer, and a magnetic tunnel junction ("MTJ") core formed between said first conductive layer and said second conductive layer.

3. An integrated circuit device according to claim 2, wherein said MRAM cell array is formed from back end layers by a back end fabrication process, and
wherein said smart power component is formed from front end layers by a front end fabrication process, and wherein said particular magnetic tunnel junction core is formed from said back end layers by said back end fabrication process, wherein the particular magnetic tunnel junction core is formed above said smart power component and electromagnetically coupled to said smart power component.

4. An integrated circuit device according to claim 3, wherein said particular magnetic tunnel junction core responds to changes in the first current produced by the smart power component.

5. An integrated circuit device according to claim 3, wherein a circuit produces the first current, wherein the circuit comprises the smart power component, the second conductive layer and the first conductive layer, and
wherein said particular magnetic tunnel junction core is configured to sense the first current and produce the second current responsive to the first current.

6. An integrated circuit device according to claim 1, wherein said smart power component comprises:
an active circuit component configured to produce the first current, wherein the active circuit component comprises one or more of a power circuit component, a power control component, and a logic component.

7. An integrated circuit device according to claim 3, wherein resistance of said particular magnetic tunnel junction core varies as a function of the first current produced by the smart power component.

8. An integrated circuit device according to claim 3, wherein said particular magnetic tunnel junction core comprises:
a first electrode; and
a second electrode, and
wherein resistance of said particular magnetic tunnel junction core varies as a function of at least one variable selected from the group consisting of:
(i) location of the first electrode or the second electrode with respect to the first conductive layer or the second conductive layer,
(ii) proximity of the first electrode or the second electrode with respect to the first conductive layer or the second conductive layer, (iii) aspect ratio of the first electrode or the second electrode with respect to the first conductive layer or the second conductive layer, (iv) size of the first electrode or the second electrode with respect to the first conductive layer or the second conductive layer, and (v) orientation of the first electrode or the second electrode with respect to the first conductive layer or the second conductive layer.

9. An integrated circuit device according to claim 1, wherein the first conductive layer further comprises:
a first magnetic shielding layer disposed below the particular magnetic tunnel junction core, and
wherein the second conductive layer further comprises:
a second magnetic shielding layer disposed above the particular magnetic tunnel junction core.

10. An integrated circuit device, comprising:
a substrate;
a magnetic random access memory ("MRAM") architecture formed on said substrate, said MRAM architecture comprising an MRAM cell array and a dummy MRAM cell, wherein said dummy MRAM cell comprises:
a particular digit line formed from a first metal layer;
a particular bit line formed from a second metal layer; and
a particular magnetic tunnel junction ("MTJ") core disposed between said first metal layer and said second metal layer, and
an active circuit component formed within the substrate, wherein said active circuit component is electrically coupled between the particular digit line and the particular bit line, wherein the active circuit component is configured to produce a first current;
wherein the particular magnetic tunnel junction core is electromagnetically coupled to said active circuit component and is configured to sense the first current and produce a second current based on the first current.

11. An integrated circuit device according to claim 10, wherein the MRAM cell array comprises a plurality of MRAM cells, wherein each of said plurality of MRAM cells comprises:
a digit line formed from said first metal layer;
a bit line formed from said second metal layer; and
a magnetic tunnel junction ("MTJ") core formed between said first metal layer and said second metal layer.

12. An integrated circuit device according to claim 11, wherein the particular magnetic tunnel junction core is formed above said active circuit component.

13. An integrated circuit device according to claim 12, wherein said particular magnetic tunnel junction core responds to changes in the first current produced by the active circuit component.

14. An integrated circuit device according to claim 12, wherein a circuit is configured to produce the first current, wherein the circuit comprises the active circuit component, the particular bit line and the particular digit line.

15. An integrated circuit device, comprising:
a dummy MRAM cell comprising a digit line, a bit line, and a particular magnetic tunnel junction ("MTJ") core disposed between said digit line and said bit line; and
an active circuit component electrically coupled between the digit line and the bit line, wherein the active circuit component is configured to produce a first current,
wherein the particular magnetic tunnel junction core is electromagnetically coupled to said active circuit component, is configured to sense the first current, and is configured to produce a second current based on the first current.

16. An integrated circuit device according to claim 15, said active circuit component comprising on selected from the group consisting of: a power circuit component, a power control component, and a logic component.

17. An integrated circuit device according to claim 15, wherein the dummy MRAM cell comprises:
a Magnetic Tunnel Junction ("MTJ") current sensor disposed over the active circuit component and the digit line, wherein the MTJ current sensor comprises the particular MTJ core configured to sense the first current and produce a second current based on the first current sensed by the MTJ core.

18. An integrated circuit device according to claim 17, wherein the MTJ current sensor, further comprises a first conductive MTJ electrode layer and a second conductive MTJ electrode layer, and
wherein the MTJ core is disposed on the first conductive MTJ electrode layer, and wherein the MTJ core further comprises a free layer, a tunnel barrier layer and a pinned layer, and wherein the second conductive MTJ electrode layer is disposed on the MTJ core.

19. An integrated circuit device according to claim 18, wherein the bit line is disposed over the MTJ current sensor, and wherein the MTJ current sensor is disposed between the digit line and the bit line.

20. An integrated circuit device according to claim 15, wherein the active circuit component is embedded within the substrate, wherein the digit line and the bit line are coupled to the active circuit component, and wherein the dummy MRAM cell comprises a Magnetic Tunnel Junction ("MTJ") current sensor.

* * * * *